United States Patent [19]

Hauser et al.

[11] 4,307,769

[45] Dec. 29, 1981

[54] METHOD AND AN APPARATUS FOR MANUFACTURING METALLIC COMPOSITE MATERIAL BARS BY UNIDIRECTIONAL SOLIDIFICATION

[75] Inventors: Jean-Michel Hauser, Meudon; Fernand Pautonnier, Paris; Maurice Rabinovitch, Chatillon, all of France

[73] Assignee: Office National d'Etudes et de Recherches Aerospatiales (O.N.E.R.A.), Chatillon, France

[21] Appl. No.: 104,833

[22] Filed: Dec. 18, 1979

[30] Foreign Application Priority Data

Dec. 29, 1978 [FR] France .................. 78 36838

[51] Int. Cl.³ .................................... B22D 27/04
[52] U.S. Cl. ......................... 164/4.1; 164/80; 164/122.1; 164/154; 164/338.1
[58] Field of Search ............... 164/60, 80, 122, 125, 164/126, 127, 128, 348, 4, 154; 222/408

[56] References Cited

U.S. PATENT DOCUMENTS

| | | | |
|---|---|---|---|
| 167,042 | 8/1875 | Walker | 222/408 X |
| 2,370,709 | 3/1945 | Barton | 222/408 X |
| 2,619,256 | 11/1952 | Wiley | 222/408 X |
| 2,819,827 | 1/1958 | Barefoot et al. | 222/408 X |
| 4,175,609 | 11/1979 | Gammal et al. | 164/60 |
| 4,178,986 | 12/1979 | Smashey | 164/60 X |

FOREIGN PATENT DOCUMENTS

| | | | |
|---|---|---|---|
| 51-18224 | 6/1976 | Japan | 164/80 |
| 1365618 | 9/1974 | United Kingdom | 164/80 |

OTHER PUBLICATIONS

A.P.C. Application of Meier, Ser. No. 414,207, Published Jun. 1, 1943.

Primary Examiner—Robert D. Baldwin
Attorney, Agent, or Firm—Karl F. Ross

[57] ABSTRACT

A method and apparatus for manufacturing bars made of an alloy by unidirectional solidification. The mold is moved relative to a hot source and a cold source disposed below the hot source. The relative positions of the two sources as well as their efficiency and the displacement speed of the mold are set so that there is established within the alloy contained in the mold a planar solidification front with a high thermal gradient at the level of the front, and so that there is produced an orientation of the structure of the alloy which is perpendicular to the solidification front. During the whole duration of the solidification, the mold is fed with alloy powder having the required nominal composition at the rate corresponding to the quantity of alloy solidified per unit of time.

9 Claims, 5 Drawing Figures

METHOD AND AN APPARATUS FOR MANUFACTURING METALLIC COMPOSITE MATERIAL BARS BY UNIDIRECTIONAL SOLIDIFICATION

FIELD OF THE INVENTION

The invention relates to a method for manufacturing metallic composite material bars by unidirectional solidification, and also to an apparatus for practicing the method.

It applies to the manufacture by directed solidification of bars of composite materials reinforced with or flakes formed during the alloy solidification. The expression "bars" should here be understood in its general meaning, viz. that they are pieces of cylindrical elongated shape the constant section of which can be circular, polygonal or complex and from which are machined the desired articles.

BACKGROUND OF THE INVENTION

The invention applies in particular to the manufacture of bars from the refractory composite materials proposed by Applicant in French Pat. No. 69,12452, in Patent of Addition No. 69,44707, in French Pat. No. 74,31140 and in French Patent Application No. 78,32151 (see U.S. Pat. No. 4,175,609, No. 3,973,750, No. 3,871,835, No. 3,985,582, No. 4,043,841) and which comprise a complex matrix made of a nickel- and/or iron-, and/or cobalt-based superalloy containing chromium as well as eventually other elements such as tungsten and aluminum and in which is present a reinforcement phase made of monocrystalline fibers of at least one transition metal monocarbide. Due to their very good mechanical properties, such materials are particularly suitable as constituent materials for parts subject in operation to high stresses at high temperatures, such as the blades of aircraft turbines.

Such parts are manufactured either from rough casts or ingots in which is machined the required part, for instance a turbine blade, or directly by casting, the alloy being solidified in a mold having substantially the shape of the required part. In the processes used hitherto, the alloy which has to be subjected to the unidirectional solidification is previously introduced at one time only into the mold, either by casting or else in the form of a prealloyed powder, viz. a powder the grains of which are substantially identical and have the nominal composition of the alloy. The mold is then shifted relative to a hot source and a cold source superimposed, the distance between the hot source and the cold source as well as the efficiency of the hot source on the one hand, and the displacement speed of the mold on the other hand, being set so that within the alloy contained in the mold is formed a rigorously planar solidification front with a high thermal gradient at the level of said front, and so as to thereby obtain grains and reinforcement flakes or fibers perpendicular to the solidification front. For materials with monocrystalline fibers of monocarbides like those of the aforementioned patents, the thermal gradient which is established is of the order of 120° to 200° C./cm at the solidification front and the mold is moved at speeds of the order of 1 cm/h.

Hitherto, it has never been possible to manufacture parts of a great length exhibiting over their whole length constant mechanical properties. In fact, and due to the great height of the liquid portion contained in the mold, there appears a segregation phenomenon connected to the convection movements of the liquid, which phenomenon is well known to metal founders. At the level of the solid-liquid interface, the constituent elements of the alloy are unequally distributed between the solid phase and the liquid phase, in accordance to their respective coefficients of parting. Thus, for instance, the chromium is incorporated to the solid in formation in a smaller proportion than its proportion in the liquid phase, the latter having therefore the tendency to become richer in chromium in the vicinity of the solidification front; on the contrary, the tungsten is preferentially incorporated to the solid in formation in a higher proportion than its proportion in the liquid phase, the latter growing poorer in tungsten. The result is that, when one wishes to manufacture a large size part and when the mold contains in consequence, at the beginning of the solidification process, a liquid portion of great height, the solidified material which is obtained as the solidification progresses unavoidably exhibits composition variations between the portion which was solidified in the first place and the portion which was solidified in the last place. As regards the particular elements which are considered here by way of example, the latter portion exhibits a chromium content and a tungsten content which are, respectively, substantially higher and lower than the contents present in the portion which was first solidified. The result is that the metallurgical structure is not constant from one end to the other of the manufactured material, the volume fraction of the reinforcement fibers within the matrix, considered in the successive cross sections of the material, altering from one end to the other due to the concentration evolution of the constituent elements of the fibers with, as a consequence, a variation of the mechanical properties of the solidified part.

OBJECTS OF THE INVENTION

It is an object of the invention to provide a method for manufacturing alloy parts by unidirectional solidification, which prevents the advent of the segregation phenomenon or at least which strongly limits its effects.

A further object of the invention is to provide a method for manufacturing bars of any length by unidirectional solidification of an alloy, said bars exhibiting nevertheless good mechanical properties remaining constant over all their length.

SUMMARY OF THE INVENTION

The method of the invention, according to which the mold is displaced in a downward movement relative to a hot source and a cold source superimposed, the relative position of the two sources as well as their efficiency being set so that a rigorously planar solidification front is established within the alloy as well as a high thermal gradient at the level of said front, whereby the starting alloy is in the form of an alloy powder of the required nominal composition, is characterized in that the mold is continuously applied with alloy powder at a given flow rate chosen in order to maintain a quantity of liquid alloy in the mold substantially constant during the whole solidification process.

Such a method allows maintaining at substantially constant values the concentrations of the various constituents of the alloy at the level of the solidification front, the uneven distribution of the constituents between the solid phase and the liquid phase at the level of the solid-liquid interface being compensated at every moment by the addition of alloy at the nominal composition as the solidification front progresses. Thereby is obtained a part which exhibits, in all its cross-sections, whatever its length, a metallic composition as well as a metallurgical structure with substantially constant properties.

Generally, according to the method of the invention, there is maintained therefore in the mold a liquid alloy phase exhibiting a composition which remains substantially constant during the whole solidification period.

The mold shape and the solidification speed allow establishing the flow rate of the alloy which is to be introduced in the mold.

An apparatus for carrying out the method of the invention comprises means for introducing the alloy powder in the mold, as the solidification progresses, at a constant flow rate corresponding to the quantity of alloy solidified by unit of time.

Advantageously, said means comprises a distribution device for the alloy powder having the required nominal composition.

BRIEF DESCRIPTION OF THE DRAWING

Further characteristics and advantages of the invention will become more apparent from the following description which is given by way of example, reference being made to the accompanying drawing wherein.

SPECIFIC DESCRIPTION

For the manufacture by casting of alloy parts of any length, with an oriented structure, particularly of the type comprising a complex matrix made of a nickel- and/or cobalt- and/or iron-based super-alloy containing chromium as well as other elements such as tungsten and aluminum, and monocrystalline reinforcement fibers formed in situ of monocarbides of transition metals, one uses a unidirectional solidification process of a starting alloy in a mold surrounded by a hot source and a cold source placed under the hot source, by displacing the mold relative to the two sources at a constant and appropriate speed, the relative positions of said sources and their efficiency being set so as to establish within the alloy a planar solidification front and a high thermal grade at said front, and by feeding continuously the mold with alloy powder in a quantity which is function of the solidification progress.

Figure 1:
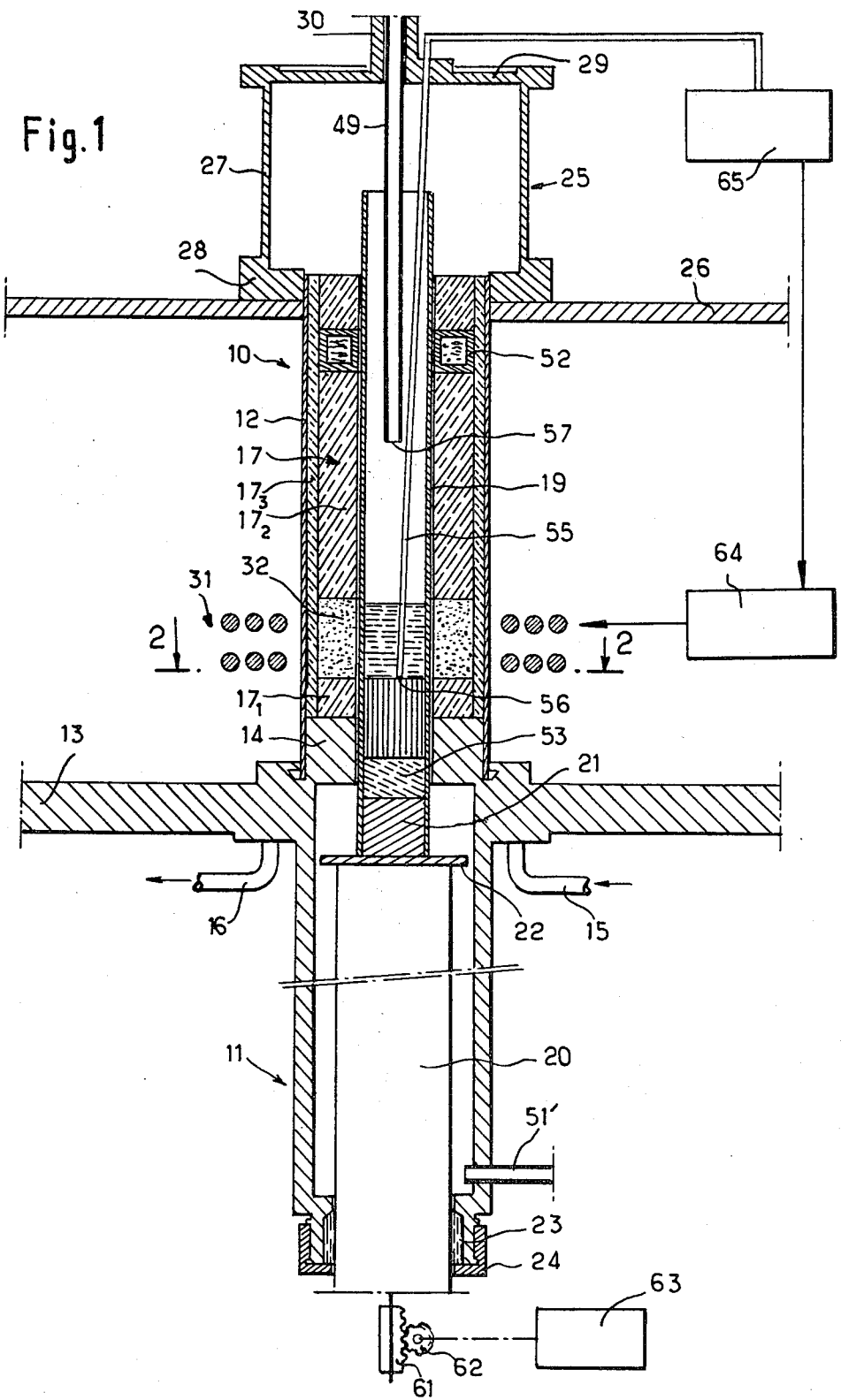
FIG. 1 is a schematic view in longitudinal section of a portion of an apparatus according to the invention.

FIG. 1 shows a part of the apparatus according to the invention, viz. the solidification oven as such.

Said oven comprises an upper chamber 10 and a lower chamber 11, the lower end of the wall 12 of the upper chamber 10 being inserted into a plate or frame 13 which is rigid with the lower chamber 11, the latter having two walls between which flows the cooling water. The wall 12 is mounted around a cooling block 14 which is also solid with frame 13, said cooling block being formed by a copper sleeve through which extend water flow passages, the water arriving through a tubing 15 and being discharged through a tubing 16.

The wall 12 of the upper chamber 10 is internally coated, above the cooling block 14, with a thermal insulation lining, for example made of a graphite felt, for reducing the lateral thermal losses and comprising a first sleeve $17_1$ of smaller diameter than that of the wall 12 and placed on the cooling block 14, a second sleeve $17_2$ spaced apart from sleeve $17_1$ by a graphite sleeve 32 and a sheath $17_3$ surrounding sleeves $17_1$ and $17_2$. The graphite felt lining 17, the sleeve 32 and the cooling block 14 are formed with a bore having a size adapted for movement of a mold 19 with a minimum clearance.

A piston 20 is slidably mounted longitudinally in the lower chamber 11, with interposition of a sealing joint 23, 24, the mold 19, which is open at its two ends, being fixed by being fitted by its lower end onto the core 21 of a support 22 formed on the upper frontal face of piston 20.

Figure 3:
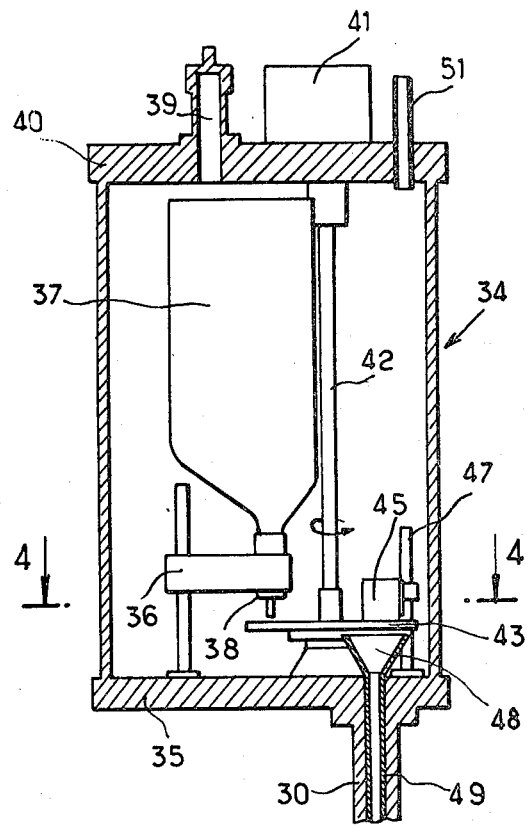
FIG. 3 is a sectional schematic view of a feed device for the powder to the apparatus of the invention.

The upper portion of wall 12 of the upper chamber 10 is covered by a cap 25 fixed on a flange 26 and having a side wall 27, a bottom 28 and a cover 29 having at its center a tubular coupling 30 provided for communicating with an alloy feed device for the mold which will be described hereinbelow with reference to FIG. 3.

An inductor 31 surrounding wall 12 of the upper chamber forms the hot source of the apparatus, the graphite sleeve 32 interposed between the sleeves $17_1$ and $17_2$ of the insulating lining 17 having the function of a resistor.

The mold 19 is formed by a thin walled tube, of thickness from 0.5 to 1.5 mm, made of a refractory oxide such as a very high purity alumina (over 99.5%) very slightly porous (less than 10%) and manufactured for example by spraying with an oxy-acetylene torch or a plasma gun a model of the bar to be solidified. A mold thus formed resists chemically to high carbon content materials when they are in the liquid state and offers a low thermal resistance which does not prevent the obtention of a high thermal gradient (of the order of 120 to 200° C./cm). Since such a mold does not have a sufficient mechanical strength for being used without previous cooking, it runs the risk of being deformed by creeping at a high temperature. Thus, we surround the mold with banding elements 33 (see FIG. 2), which may be graphite rings stuck onto each other around the mold, or by a sleeve made of a carbon-carbon composite material.

A powder distribution device 34 (FIG. 3), connected to the solidification oven through the junction 30, comprises a casing 34 with a bottom 35 on which is fixed a support bracket 36 for a powder tank 37 provided with an interchangeable nozzle 38 discharging the powder, an opening 39 for feeding the powder tank 37 being provided in the cover 40 of casing 34. The cover 40 carries a driving motor 41 of adjustable speed driving a vertical axis 42 housed inside casing 34 and carrying at its other end a rotating horizontal plate 43.

Figure 4:
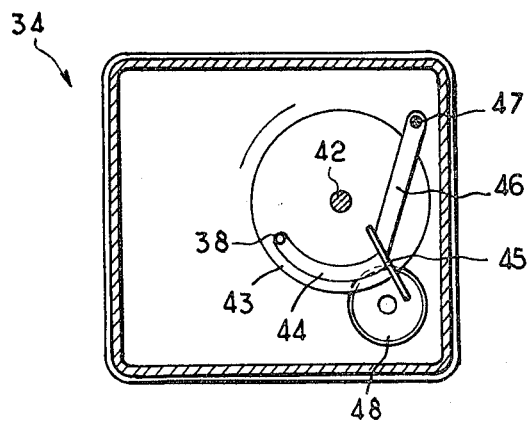
FIG. 4 is a sectional view along line 4—4 of FIG. 3.

In operation of the distributor, a calibrated bead or ribbon of pre-alloyed powder 44 flows through the nozzle 38 of the powder tank 37 onto the plate 43, powder which, while the plate 43 rotates (FIG. 4), is forwarded by a blade 45 carried by an arm fixedly mounted onto a pin 47 into the introduction opening of a funnel 48 the discharge channel 49 of which is mounted in the bore of the tubular connection 30 and emerges inside the mold 19. The flow of powder is regulated by choosing the diameter of the nozzle 38 and by setting the rotation speed of plate 43.

The inner free volume of the oven can be degassed and placed in a reducing atmosphere, for example argon containing 5% of hydrogen, introduced by an input channel 51 extending across the powder distributor cover 34, and discharged by a channel 51' arranged at the lower portion of the lower chamber 11 of the oven. With the same aim of "capturing" the oxygen of the oven atmosphere, we place in the thermal insulation lining 17 of the oven upper chamber 10 a crucible 52 filled with a deoxidizing agent, such as Ti-Zr chips (50/50), said crucible being in a location such that when the oven is set in operation, the temperature to which it is exposed is that corresponding to the deoxidizing activity of the material it contains.

An apparatus according to the invention is operated as follows:

On the core 21 of support 22 made of a refractory steel, the cross-section of which is identical to the inner cross-section of the mold 19,—taking into account the dilatation clearances—, one places a block of alloy, or bar-foot 53, of same composition as the powder and also of same cross-section as the inside of the mold-taking into account the dilatation clearances. The mold 19 is then inserted onto the block 53 and then on the core 21 and after the banding elements 33 are placed around the mold. The piston 20 carrying the mold is moved by means of a rack 61 and a gear 62 coupled with a motor 63, so that the upper face of the bar-foot 53 is at the level of the upper portion of the resistor 32. The chamber is then closed, degassed, filled with an argon and hydrogen mixture at a slight overpressure, the resistor 32 being then progressively raised to its operational temperature by high frequency induction, provided by the inductor 31 fed by a source 64. The distance between the resistor 32 and the cooling block 14, as well as the heating conditions, are set so that the isotherm corresponding to the melting point of the alloy to be solidified is placed in the unidirectional and vertical thermal flux zone, that is in the zone where the heat exchange through the side wall of the apparatus are non-existent due to the presence of the insulating lining 17, and more precisely so that the solid-liquid interface is at a few millimeters below the lower level of resistor 32, the position of the solidification front being indicated by a thermocouple 55 the sensing joint 56 of which is positioned immediately above the solidification front level, in the liquid portion of the alloy. The thermocouple 52 is connected to a temperature monitor 65 which adjusts the energy feeding the inductor 31 in order to maintain constant the temperature in the area of the sensing joint 56 of the thermocouple 55.

The powder feed channel 49 is placed in the mold with its outlet opening 57 positioned at a distance from the free surface of the liquid alloy contained in the mold such that, on the one hand, the temperature of the area in which is placed said outlet opening 57 is not sufficient for the powder grains to melt therein, and, on the other hand, the latter are spread finely shower-wise and are distributed on all the surface of the liquid alloy.

The mold is then fed with powder by driving in rotation the rotating plate 43, and the mold is simultaneously moved downwards. The powder feed rate is set so that the upper level of the liquid alloy remains in the same position relative to the fixed elements of the solidification oven, or in other words so that the volume of the liquid alloy contained by the mold remains constant.

Taking into account the solidification speed and the size of the mold, one calculates the quantity of solidified alloy by unit of time and one sets accordingly the powder feed rate of the mold by a suitable choice of the size of the nozzle 38, by setting the position of its opening relative to the plate 43 and the rotation speed of said plate.

After a duration of a few minutes of displacement of the mold, one reaches stationary thermal conditions as well as stationary diffusion conditions of the elements of the alloy from the solid phase to the liquid phase. The small volume of the liquid phase and the constant feed in the liquid portion of constant volume of powder having the nominal composition of the alloy to be solidified allow maintaining a constant average composition in the liquid in spite of the fact that the distribution of the elements is different in the liquid phase and in the solid phase at the solidification front and in spite of the stirring of the liquid due to convection. The solidified alloy according to the invention thus exhibits much more reduced segregations than an alloy of same nominal composition which would have been solidified by any other known method which does not comprise the metered alloy feed to the mold as the solidification progresses and in which all the alloy mass would be initially in the liquid state.

The movement of the mold, the powder feed and the heating are interrupted when the surface of the liquid bath reaches the upper end of the mold. The length of the latter and the space available for its displacement are therefore the only limits to the length of the part obtained by unidirectional solidification.

EXAMPLE 1

Figure 2:
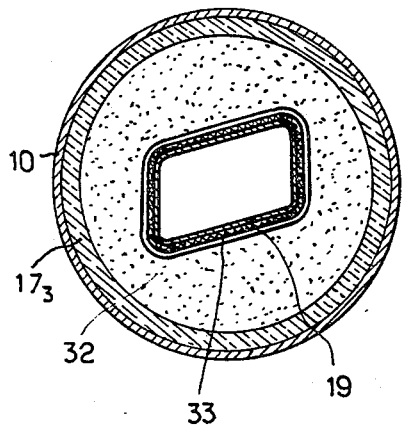
FIG. 2 is a cross-sectional view along line 2—2 of FIG. 1.

A bar in a nickel-based super-alloy of the following composition (by weight): base Ni—10% Cr—10% W—20% Co—4% Al—4.9% Nb—0.55% C, is manufactured by using the method of the invention in a mold having a cross-section shown in FIG. 2, viz. a cross-section in the shape of a parallelogram of 22 mm×35 mm with rounded angles of 75°.

The mold is placed in the oven and fed with the alloy so that the height of the melted zone, at the maximum operating temperature, viz. 1600° C., is of the order of 50 mm. The thermal gradient established is of the order of 140° C./cm and the solidification speed, in other words, the displacement speed of the mold, is of 1.2 cm/h.

Figure 5:
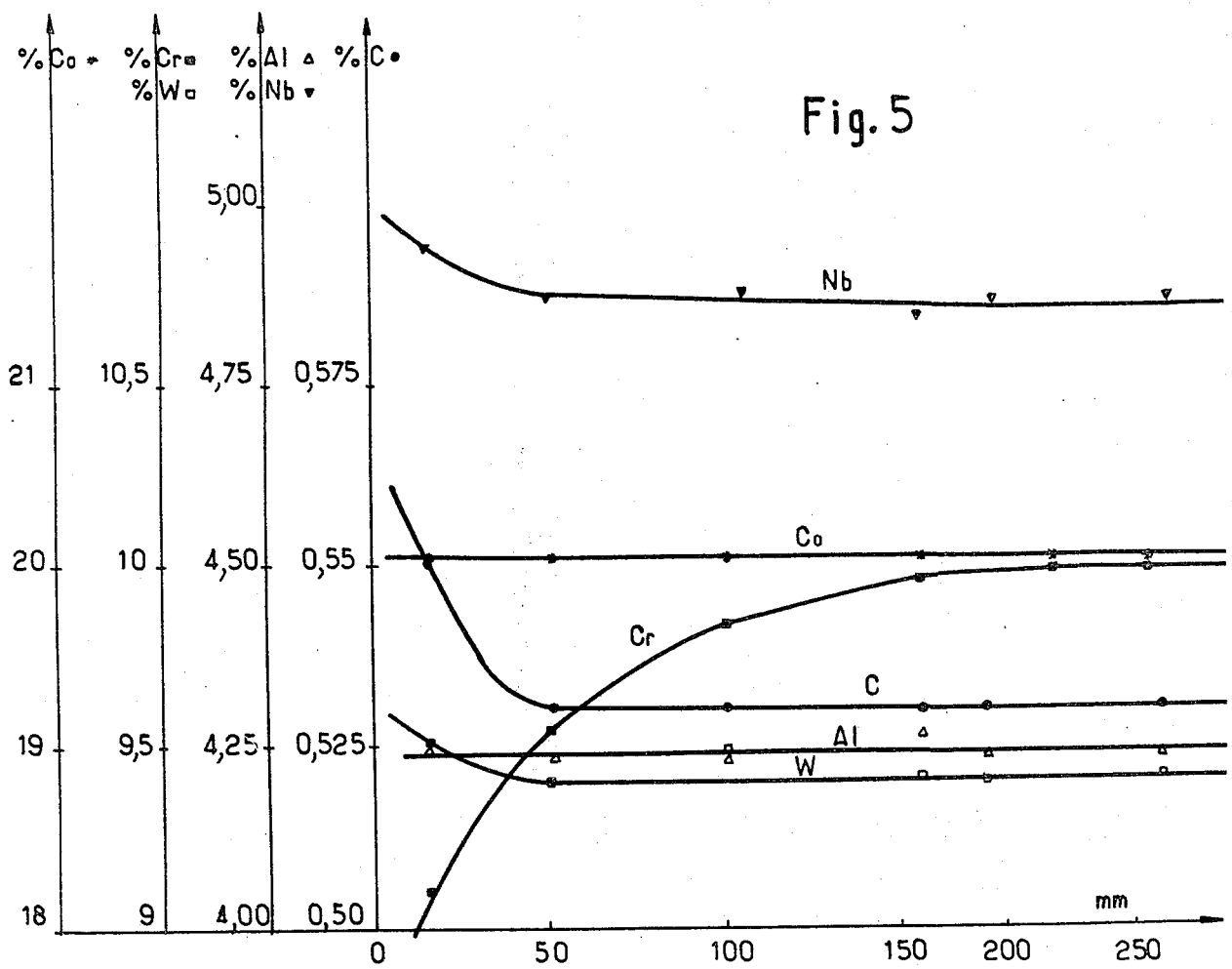
FIG. 5 is a diagram of the composition of a bar made of a composite super-alloy obtained by the method of the invention.

FIG. 5 shows the representative curves of the content of the bar for each of the elements others than that forming the base, namely the nickel, by plotting in abscissas the solidified length in mm and in ordinate the content in % by weight of each of the elements. From said curves, it is clear that if one suppresses at the beginning of the bar a length portion equivalent to the height of the liquid zone, viz. about 50 mm, the variation of the contents of the bar obtained in each of the elements is less than 5% (as a relative value) along the length the bar, and is less than 2% (as a relative value) if one leaves out the chromium element. The oriented fibrous structure, which is formed by the matrix reinforced by the niobium monocarbide fibres, is perfect along its whole length and no evolution of the volume fraction of the niobium monocarbide fibres is noticeable.

The representative curves of the element concentration as a function of the solidified length all tend towards an asymptote the ordinate of which represents the content of the corresponding alement in the parent alloy. This fact confirms that one can obtain bars of solidified alloy of any length exhibiting no segregation over their length as regards their metallic composition and their metallurgical structure, and this, while always putting aside the first portion of the solidified zone, that is that corresponding to the height of the liquid zone.

EXAMPLE 2

One solidifies under the same conditions as those of Example 1 a bar made of an alloy of following composition by weight: base Ni—10% Co—4% Cr—10% W—16% Al—4.2% Nb—0.46% C—2% Mo.

The variations of the contents in each of the elements, including the addition elements, of the bar obtained after solidification are similar to those of Example 1. The fibrous structure of the composite material is without defect through the whole solidified length and no evolution of the volume fraction of the fibres is noticed.

EXAMPLE 3

Bars made of an alloy as in Example 1 on the one hand, and of an alloy as in Example 2 on the other hand, of rectangular cross-section of 12 mm×65 mm, with rounded ends, are obtained by unidirectional solidification under the same conditions as those of Examples 1 and 2.

The contents variations of the addition elements in the bars obtained are similar to those of Examples 1 and 2. The structure of the obtained composite is also perfectly fibrous, with a constant volume fraction over the whole solidified portion.

COMPARISON EXAMPLE

As a comparison, a bar has been prepared by unidirectional solidification with the same alloy as that indicated in Example 1, having the same cross-section as in said Example and a total length of 250 mm corresponding to a length which can be obtained by using the prior art methods.

A bar has been prepared by unidirectional solidification according to a usual method without continuous feed (method A), the total length of the initially melted portion being equal to 250 mm.

On the other hand, a bar of same length has been prepared by unidirectional solidification, but with the method with continuous feed of a pre-alloyed powder according to the invention (method B), the height of the melted zone being of 50 mm.

In one and the other method, the thermal gradient established was of 140° C./cm, and the solidification speed of 1.2 cm/h.

Cross-sectional cuts have been effected on the bars obtained, and the proportion in weight of some of the elements in each of said cuts has been established.

The results of these tests are shown in the following Table.

TABLE

Comparison of the compositions of alloy bars obtained by unidirectional solidification, of same total length
A - by a standard method without continuous feed (total length of the initially melted portion: 250 mm)
B - by the method with continuous feed of a pre-alloyed powder (height of the melted zone: 50 mm)

| Distance from the beginning of the solidification (mm) | Cr % A | Cr % B | W % A | W % B | C % A | C % B |
|---|---|---|---|---|---|---|
| 15 | 8.8 | 9.1 | 11.8 | 9.51 | 0.61 | 0.55 |
| 50 | 9.0 | 9.54 | 11.65 | 9.38 | 0.57 | 0.53 |
| 100 | 9.45 | 9.83 | 11.4 | 9.50 | 0.54 | 0.53 |
| 155 | 10.4 | 9.95 | 10.8 | 9.38 | 0.535 | 0.53 |

TABLE-continued

Comparison of the compositions of alloy bars obtained by unidirectional solidification, of same total length
A - by a standard method without continuous feed (total length of the initially melted portion: 250 mm)
B - by the method with continuous feed of a pre-alloyed powder (height of the melted zone: 50 mm)

| Distance from the beginning of the solidification (mm) | Cr % A | Cr % B | W % A | W % B | C % A | C % B |
|---|---|---|---|---|---|---|
| 200 | 10.8 | 9.99 | 10.5 | 9.40 | 0.525 | 0.53 |
| relative composition difference between distances 50 and 200 mm | 18% | 4.5% | 11% | 1%* | 10% | 0%* |

*Except for the titration precision

We claim:

1. A method of producing an alloy bar by unidirectional solidification comprising the steps of:
    (a) positioning a heat source above a cold source in a melting and solidification zone;
    (b) continuously displacing an elongated tubular mold having a cross sectional shape corresponding to that of the bar to be produced through said heat source and said cold source downwardly at a constant rate over the length of said mold to form a molten liquid portion of alloy in said mold and enable solidification of molten alloy within said mold below said liquid portion;
    (c) setting the relative efficiency of said sources and the displacement speed of said mold to maintain a planar solidification front at the bottom of said liquid portion with a high thermal gradient at the level of said front with said mold being progressively lowered past said front and a solidified bar being formed at said front with continuous and progressive increase in length as said mold is lowered past said front,
    (d) sensing the position of said solidification front;
    (e) controlling the relative efficiency of said sources in response to the sensing of said front to maintain constant the temperature in the area of said front; and
    (f) continuously feeding a powder of said alloy at a substantially constant rate into said mold to maintain said liquid portion with a small but substantially constant volume over the entire duration of solidification of said bar and for the entire length of formation thereof, the feed rate of said alloy powder being controlled to correspond to the rate of alloy solidification at said front so that said bar has substantially constant mechanical and structural properties over its entire length.

2. A method according to claim 1 wherein the powder feed is at a constant rate.

3. A method according to claim 1 wherein the alloy powder is introduced so as to fall in a thin shower with the grains distributed over the whole upper surface of the portion of the liquid alloy which contains the mold.

4. An apparatus for molding alloy bars by unidirectional solidification of refractory metallic composite material, comprising, in an oven, a thin walled mold surrounded by a hot source and a cold source placed below the hot source, means for displacing the mold relative to the two sources, means for controlling the relative efficiency of said sources in order to establish within the alloy contained in the mold a planar solidification front under high thermal gradient at the level of said front and to produce an orientation of the structure of the alloy perpendicular to the solidification front, means for sensing the position of said solidification front, means responsive to said sensing means for controlling the relative efficiency of said sources to maintain constant the temperature in the area of said front, means for continuously feeding the mold during the whole duration of the solidification precedure with alloy powder of the required nominal composition in order to maintain in the mold a liquid portion of small and constant volume and means for setting said feed means according to the quantity of alloy solidified per unit of time.

5. An apparatus according to claim 4 wherein the feed means comprises a powder distributor with adjustable flow rate.

6. An apparatus according to claim 5 wherein the distributor comprises a tank the outlet nozzle of which distributes the powder on a rotating plate in the shape of a circular ribbon, the powder deposited on the plate being forwarded during rotation of the plate by a blade which directs it towards the opening of a duct emerging in the mold.

7. An apparatus according to claim 6 wherein the tank comprises nozzle mounting means such that nozzles of different diameters can be mounted therein and the distributor comprises means for setting the rotation speed of the plate.

8. An apparatus according to claim 5, further comprising means for supporting the powder distributor with respect to the mold, said supporting means being settable so that the outlet duct of the powder distributor emerges in the mold at a height such, relative to the upper level of the liquid alloy, that the powder falls in shower over the whole surface of the liquid alloy.

9. An apparatus according to claim 4, further comprising means for supporting molds of any desired length corresponding to any height required for the bar.

* * * * *